United States Patent [19]

Okuhara

[11] Patent Number: 5,549,754

[45] Date of Patent: Aug. 27, 1996

[54] LEAD FRAME HOLDER

[75] Inventor: Shizuo Okuhara, Nagaokakyo, Japan

[73] Assignee: Murata Manufacturing Co., Ltd., Japan

[21] Appl. No.: 265,688

[22] Filed: Jun. 24, 1994

Related U.S. Application Data

[60] Division of Ser. No. 154,754, Nov. 17, 1993, abandoned, which is a continuation-in-part of Ser. No. 875,377, Apr. 29, 1992, abandoned.

[30] Foreign Application Priority Data

Apr. 30, 1991 [JP] Japan .................................. 3-126597

[51] Int. Cl.⁶ .................................................. B05C 13/02
[52] U.S. Cl. ..................... 118/500; 118/503; 204/289.15; 269/254 R; 269/903
[58] Field of Search ..................................... 118/500, 503; 204/298.15; 269/254 R, 903

[56] References Cited

U.S. PATENT DOCUMENTS

| | | | |
|---|---|---|---|
| 2,443,574 | 6/1948 | Burns | 269/254 R X |
| 2,475,721 | 7/1949 | Prime | 269/254 R X |
| 4,700,935 | 10/1987 | Winslow et al. | 269/254 R X |
| 4,817,559 | 4/1989 | Ciparisso | 118/503 X |
| 4,900,586 | 2/1990 | Kanamori et al. | 118/503 X |
| 5,325,812 | 7/1994 | Thiebaud et al. | 118/500 |

FOREIGN PATENT DOCUMENTS

| | | |
|---|---|---|
| 3815713 | 5/1988 | Germany . |
| 3819207 | 6/1988 | Germany . |

*Primary Examiner*—David A. Simmons
*Assistant Examiner*—Paul M. Rivard
*Attorney, Agent, or Firm*—Ostrolenk, Faber, Gerb & Soffen, LLP

[57] ABSTRACT

Four non-magnetic substrate members are coupled in parallel with each other by a pair of guide plates, and a plurality of receiving grooves, which can slidably receive strip portions of lead frames, are formed in the upper surface of each substrate member in parallel with each other. Permanent magnets for attracting the lead frames are fixed in proximity to bottoms of the receiving grooves. Lead frames, to which electronic component elements are mounted, can be easily inserted into and taken out from the receiving grooves by simply sidewardly slid into and from the receiving grooves, and the lead frames inserted in the receiving grooves are stably held by the permanent magnets due to magnetic force.

6 Claims, 3 Drawing Sheets

LEAD FRAME HOLDER

CROSS-REFERENCE TO RELATED APPLICATION

This is a division of application Ser. No. 08/154,754, filed Nov. 17, 1993, now abandoned, which is a continuation-in-part of Ser. No. 07/875,377 filed Apr. 29, 1992, now abandoned.

BACKGROUND OF THE INVENTION

The present invention relates to a lead frame holder, which is preferably employed for dip-coating electronic components with protective resin, or the like.

In the course of manufacturing electronic components having flat plate type lead terminals, after electronic component elements are fixedly mounted on lead frames, the lead frames are brought into a dip-coating vessel so that layers of protective resin are formed on the peripheries of the electronic component elements mounted thereon. Each of the lead frames is formed by a metal plate so as to have a connective strip portion and a plurality of lead terminals projecting from the strip portion in a direction perpendicular thereto. The elements are fixed at the end portions of those lead terminals by soldering or the like.

However, since lead frames can be bent easily, it is difficult to dip the respective elements into a protective resin solution in the dip-coating vessel equally at a certain depth. Also, since lead frames should be dip-coated one by one, the workability could not be improved. After the dip-coating step, the lead frames should be carried to a heat treating furnace so that the protective resin are dried and solidified therein. At this step also, the lead frames should be carried one by one, to lead to inferior workability.

SUMMARY OF THE INVENTION

Accordingly, an object of the present invention is to provide a lead frame holder, which can perform dip-coating of a plurality of lead frames simultaneously, so as to attain high workability at dip-coating step.

Another object of the present invention is to provide a lead frame holder, which can easily hold and discharge lead frames.

Still another object of the present invention is to provide a lead frame holder, which can prevent bending of lead frames and reduce height variation of the respective positions of the electronic component elements mounted to the lead frames.

The holder according to a first embodiment of the present invention comprises a substrate, a plurality of parallel receiving grooves provided on an upper surface of said substrate and a permanent magnet fixed to the substrate. The receiving grooves open at least on one side of the substrate and are capable of slidably receiving strip portions of the lead frames. The permanent magnet attracts the lead frames to the receiving grooves by magnetic force.

Hoop-type lead frames to which electronic component elements are mounted are sidewardly inserted into the receiving grooves provided in the substrate. In order to prevent the lead frames from displacement or decrease inclination of the lead frames, the depths of the receiving grooves are preferably made substantially equal to or slightly larger than the widths of the strip portions of the lead frames. Further, the widths of the receiving grooves are preferably made slightly larger than thickness of the strip portions of the lead frames in order to decrease inclination of the lead frames while allowing slidability of the lead frames.

The strip portions of the lead frames are attracted and held by magnetic force of the permanent magnet, which is fixed in proximity to the receiving grooves. Attraction of the permanent magnet is so set that the lead frames will not drop from the receiving grooves when the holder is inverted for dip coating.

It is possible to take out the lead frames from the holder by simply drawing them out sidewardly from the holder through sideward openings of the receiving grooves. Since the lead frames can be sidewardly inserted in and taken out from the holder, automation is made possible and workability is remarkably improved as compared with the conventional operations which involve manually inserting and taking out the lead frames. In order to smoothly guide the lead frames which are inserted in the receiving grooves of the holder, at least first sides of the openings of the receiving grooves are preferably formed in a divergent manner.

When the substrate is formed of a non-magnetic material and the permanent magnet is fixed on the lower surface of the substrate close to the bottoms of the receiving grooves, the lower edges of the lead frames are brought into close contact with only the bottoms of the receiving grooves, so that contact areas between the lead frames and the substrate are reduced, whereby the lead frames can be easily taken out from the receiving grooves. Since the lower edges of the lead frames are thus brought into close contact with the bottoms of the receiving grooves, bending of the lead frames can be prevented so as to reduce height variation of the electronic component elements. Thus, it is also possible to reduce variation of the positions of the electronic component elements to be coated with protective resin, whereby the present invention can be easily applied to electronic components with short lead terminals, dissimilarly to the prior art.

When a groove for fixing the permanent magnet is formed in the lower surface of the substrate, the permanent magnet can be easily fixed on the substrate in such way that it does not contact the lead frames, whereby the magnet is protected against the lead frames.

While the substrate can be prepared from a single large-sized plate, it is preferably formed by a plurality of substrate members which are coupled in parallel with each other, so that the receiving grooves can be easily worked, warping of the substrate members due to working can be suppressed, and the holder can be reduced in weight.

Meanwhile, the holder according to a second embodiment of the present invention comprises a spring member which exerts pressure against the lead frames in order to hold them. In this case, the holder comprises a holder body having at least two side walls formed oppositely, a plurality of guide shafts which are fixed across the two side walls of the holder body in parallel with each other and which support the lowermost end of the strip portion of each of the lead frames, a plurality of holding plates which are arranged in the holder body in parallel with each other and which are passed through by the guide shafts in a slidable manner, and a spring member which can take pressing position and releasing position and which presses the holding plates along the guide shafts in the pressing position. When the strip portions of the lead frames are inserted between the respective pairs of the holding plates and the spring member is in the pressing position, the strip portions of the lead frames are stably held under pressure by the holding plates due to the pressing force of the spring member.

In order to hold lead frames in the above-described holder, first the spring member should be moved to the releasing position so that its pressure against the holding plates is cancelled, and the holding plates are slidably released along the guide shafts so that spaces are made between the respective pairs of holding plates. Then, the strip portions of the lead frames are inserted into the respective spaces between the holding plates. Thereafter, the spring member is moved to the pressing position. Owing to the pressure exerted by the spring member, both major surfaces of the strip portions of the lead frames are so pressed by the holding plates that the lead frames are stably held without bending. Moreover, when the lead frames are inserted between the holding plates, the lowermost ends of the lead frames are stopped by the guide shafts at the same level, thereby the heights of the respective lead frames in the holder become identical to each other.

When the lead frames should be taken out from the holder, the spring member is moved back to the releasing position so that its pressure against the holding plates is cancelled, and then the holding plates are slidably released along the guide shafts so that the lead frames can be taken out from the spaces between the respective pairs of the holding plates.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
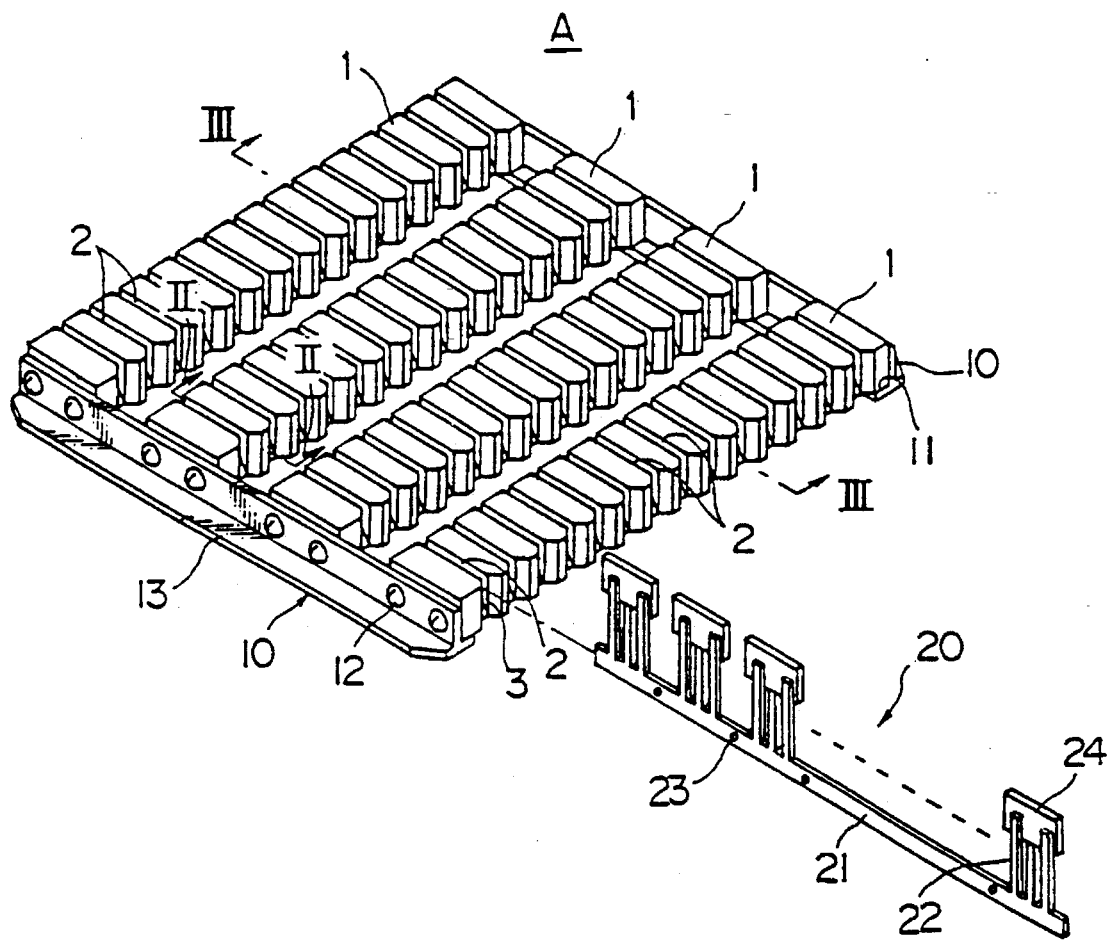
FIG. 1 is a perspective view showing a holder according to a first embodiment of the present invention, in a state for receiving a lead frame.

FIG. 1 shows a holder A according to a first embodiment of the present invention. This holder A is formed by four rectangular substrate members I and a pair of guide plates 10 having inverse T-shaped sections. Each substrate member 1, which is made of a non-magnetic metal such as aluminum, is provided on its upper surface in a shorter edge direction with a number of parallel receiving grooves 2 which are open at both ends. The depth of each receiving groove 2 is substantially equal to the cross-directional size of a strip portion 21 of a lead frame 20. A first opening 3 of each receiving groove 2 is tapered by forming an inclined surface 4, which is gradually downwardly inclined toward the opening 3, in a bottom portion of the groove 2 close to the opening 3. The opening 3 and the inclined surface 4 are adapted to smoothly guide an end portion of the lead frame 20, which is sidewardly inserted in the holder A. On the other hand, a substantially T-shaped groove 5 is longitudinally continuously formed in the lower surface of each substrate member 1, so that a pole-type permanent magnet 6 having a rectangular section can be embedded in and fixed to this groove 5. Thus, magnetic force of the permanent magnet 6 acts on the strip portion 21 of each lead frame 20 inserted in each receiving groove 2, to attract and hold the strip portion 21 along the direction of the receiving groove 2.

Both end portions of each substrate member 1 are placed on stepped faces 11 of the guide plates 10 and fixed thereto by screws 12, so that the four substrate members 1 are coupled with each other and fixed to the guide plates 10 in a parallel manner. Since four substrate members 1 have the same structure, the receiving grooves 2 of the substrate members 1 are aligned with each other. Horizontal portions 13 of the guide plates 10 are held by a driving mechanism (not shown), to support the holder A for receiving and discharging lead frames 20, dip-coating them, carrying them to a heat treating furnace, and the like.

Each lead frame 20, which is press-worked from a plate of a magnetic metal such as Fe, comprises the continuous strip portion 21 and triplets of lead terminals 22 upwardly projecting from the strip portion 21 in parallel with each other. The strip portion 21 is provided with pilot holes 23 at regular intervals. An electronic component element 24 is connected and fixed to each triplet of the lead terminals 22 by soldering or the like.

A method of using the holder A is now described.

Figure 2:
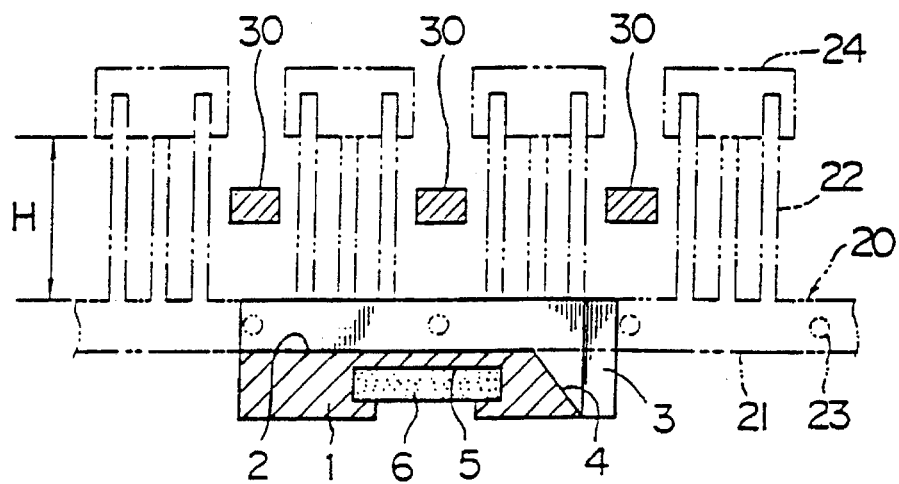
FIG. 2 is an enlarged sectional view taken along the line II—II in FIG. 1.
Figure 3:
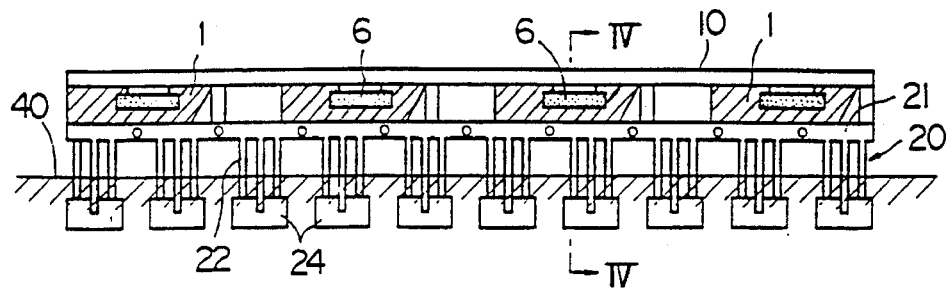
FIG. 3 is a sectional view taken along the line III—III showing a dip coating step.
Figure 4:
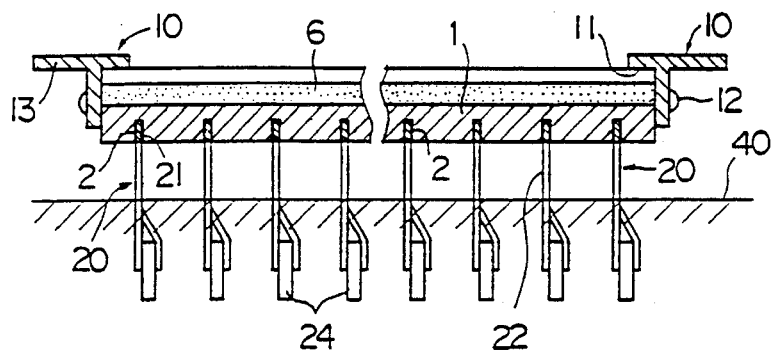
FIG. 4 is a sectional view taken along the line IV—IV in FIG. 3.

First, the receiving grooves 2 of the holder A are set upwardly. Then, pawls 30 (see FIG. 2) of an introducing and discharging mechanism are inserted between the respective triplets of the lead terminals 22 of the lead frames 20 in a preceding step, and the lead frames 20 are sidewardly inserted one by one in the receiving grooves 2 of the holder A. At this time, the forward ends of the strip portions 21 are guided into the receiving grooves 2 by the openings 3 and the inclined surfaces 4, so that the lead frames are smoothly guided even if they are slightly misaligned with grooves 2 in the horizontal or vertical direction, and the strip portions 21 are not deformed. When a first lead frame 20 is completely inserted in first grooves 2, the holder A is moved by one pitch in a direction perpendicular to the receiving grooves 2, to receive a second lead frame 20 in second grooves 2. Such an operation is repeated until the lead frames 20 are inserted in all receiving grooves 2. The lead frames 20 thus inserted in the receiving grooves 2 of the substrate members 1 are attracted and held by the permanent magnets 6 which are embedded in proximity to the bottom portions of the receiving grooves 2, so that the lower edges of the strip portions 21 are in close contact with the bottoms of the receiving grooves 2. Thus, it is possible to prevent bending of the lead frames 20, thereby reducing variation in heights H of the electronic component elements 24 in the relation to the substrates 1 to approximately 0.2 mm (see FIG. 2). Then, the holder A is inverted for dip coating. Also at this time, the lead frames 20 will not drop from the receiving grooves 2, due to attraction of the permanent magnets 6. After the lead frames 20 are inverted, the electronic component elements 24 are dipped in a protective resin solution 40, as shown in FIGS. 3 and 4. In this case, variation in coating of the protective resin solution 40 is reduced due to the small variation in heights H of the electronic component elements 24, whereby it is possible to obtain electronic components of uniform quality. After the dip coating step, the holder A is again inverted to upwardly direct the lead frames 20, and is carried into a heat treating furnace (not shown), so that layers of the protective resin solution 40 applied toward the peripheries of the electronic component elements 24 are dried and solidified therein. After the layers of the protective resin solution 40 are solidified, the pawls 30 (see FIG. 2) of the introducing and discharging mechanism are again inserted between the triplets of the lead terminals 22, and the lead frames 20 are sidewardly drawn out in a horizontal manner, to be carried to a subsequent step.

Figure 5:
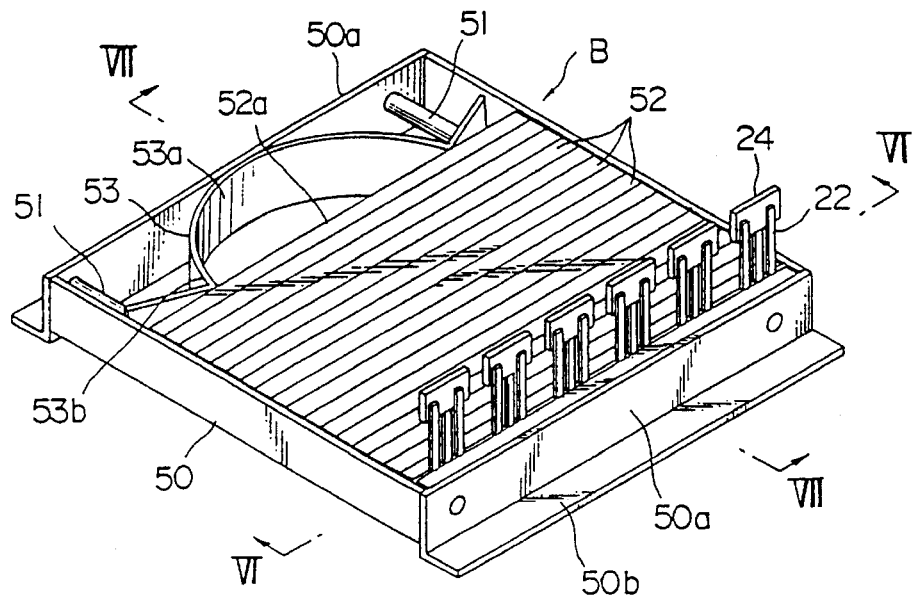
FIG. 5 is a perspective view showing a holder according to a second embodiment of the-present invention.
Figure 6:
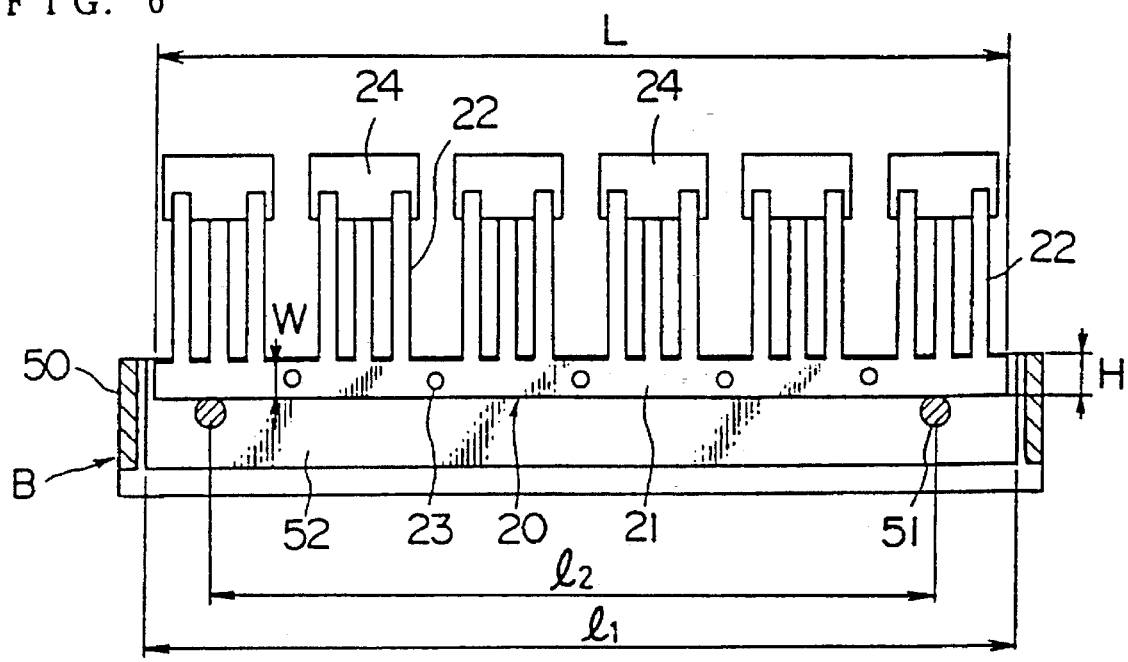
FIG. 6 is a sectional view taken along the line VI—VI in FIG. 5.
Figure 7:
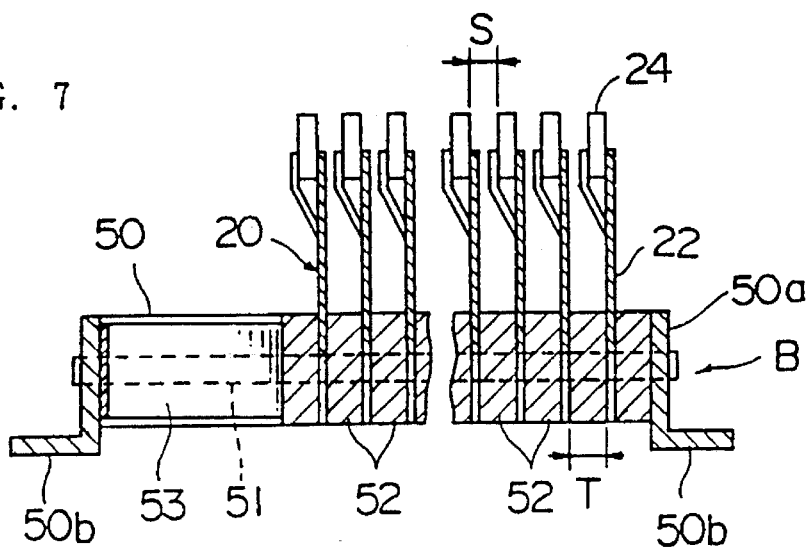
FIG. 7 is a sectional view taken along the line VII—VII in FIG. 5.

FIGS. 5 to 7 show a holder according to a second embodiment of the present invention. This holder 8 comprises a rectangular framework 50, two guide shafts 51 which are fixed across the two opposite side walls 50a of the framework 50 in parallel with each other, and a plurality of holding plates 52 whose both end portions are passed through by the guide shafts 51 in a slidable manner. It also comprises a spring plate 53, which is formed like a letter $\Omega$ and whose both end portions are also passed through by the guide shafts 51. The center portion 53a of this spring plate 53 can be brought into pressure contact with the inner surface of the framework 50, and the both crooked portions 53b close to the end portions of this spring plate 53 can be brought into pressure contact with the endmost holding plate 52a.

The length $l_1$ of the above mentioned holding plate 52 is made to be equal to or slightly longer than the length of the strip portion 21 of the lead frame 20, and the distance $l_2$ between the two guide shafts 51 is made to be shorter than the length L of the strip portion 21. Also, the distance H from the uppermost surface of the guide shaft 51 to the upper end of the holding plate 52 is made to be substantially equal to the width W of the strip portion 21. Further, the thickness T of the holding plate 52 is set to be so long as to make enough spaces S between the adjacent elements 24 in the thickness direction when the lead frames 20 are held between the respective pairs of holding plates Among the side walls of the framework 50, the opposite two side walls 50a, to which both ends of the guide shafts 51 are fixed, have L-shaped sections with horizontal portions 50b. These horizontal portions 50b are held by a driving mechanism (not shown) so as to carry the holder B to a dip-coating step, a heat treating step and the like.

A method of Using the holder B is now described.

First, the center portion 53a of the spring plate 53 is turned upward or downward so that the center portion 53a is removed from the framework 50. Thus, the pressure exerted by the spring plate 53 against the respective holding plates 52 is cancelled, and then the holding plates 52 are slidably guided along the guide shafts 51 so that spaces are formed between respective pairs of holding plates 52. Next, the strip portions 21 of the lead frames 20 are inserted from above into respective spaces between the holding plates 52. At this time, since the lowermost ends of respective strip portions 21 are stopped by the guide shafts 51, the heights of the lead frames 20 which extend above the holding plates 52, in other words, the heights of the electronic component elements 24 become identical to each other. After the lead frames 20 are inserted in the holder, the center portion 53a of the spring plate 53 is turned back so that the spring plate 53 is interposed between the endmost holding plate 52a and the framework 50, thereby the strip portions 21 of the lead frames 20 are stably held between the respective pairs of holding plates 52 under pressure.

Then, the holder B, which is now holding a number of lead frames 20, is inverted to downwardly direct the lead frames 20 for dip-coating. At this time, the lead frames 20 will not drop out of the holder B since they are stably held by the holding plates 52 owing to the pressure exerted by the spring plate 53. After the lead frames 20 are inverted, the electronic component elements 24 are dipped into a protective resin solution in a dip-coating vessel. In this case, variation in coating of the protective resin solution is reduced due to the small variation in heights of the electronic component elements 24, whereby it is possible to obtain electronic components of uniform quality.

After the dip coating step, the holder B is again inverted to upwardly direct the lead frames 20, and is carried into a heat treating furnace (not shown), so that layers of the protective resin solution applied toward the peripheries of the electronic component elements 24 are dried and solidified therein. After the layers of the protective resin solution are solidified, the horizontal portions 50b of the holder B are supported by a driving mechanism so that the holder B is carried to a next step.

In order to take out the lead frames 20 from the holder B, first the spring plate 53 is turned upward or downward so that its pressure against the holding plates 52 is cancelled. Then, the holding plates 52 are slidably released along the guide shafts 51, and the lead frames 54 are taken out from spaces between the respective pairs of holding plates 52.

The present invention is not restricted to the above embodiment, but various modifications are available within the scope of the present invention, as a matter of course. For example, in the first embodiment, the four substrate members 1 are coupled in parallel by the pair of guide plates 10 in the above embodiment in order to suppress warp of the substrate members 1 due to working of the receiving grooves 2 as well as to reduce the weight of the holder A. Alternatively, receiving grooves may be formed on the upper surface of a single large-sized substrate. In this case, it is possible to form stepped portions on both sides of the substrate, thereby omitting the guide plates.

The permanent magnets may be fixed at least in proximity to the receiving grooves. It is not requisite to employ the pole-type permanent magnets which extend along the overall lengths of the substrate members as shown in the aforementioned embodiment.

The non-magnetic material for the substrate is not restricted to a metal such as aluminum, but a resin material may also be employed.

The receiving grooves may not open at both ends, but the openings may be provided only at first ends. When the receiving grooves have openings at both ends, however, the lead frames can advantageously be inserted and taken out in two directions.

In the second embodiment, the spring member is not restricted to a spring plate which is shaped in a letter $\Omega$. A coil spring and a coned disc spring may be available as well as a spring plate so far as they can take pressing position and releasing position and exert even pressure against the holding plates in the pressing position.

Also in the second embodiment, a plate-shaped member having two opposite side walls, for example, may be employed in place of the rectangular framework as the holder body. In this case, the lead frames may be sidewardly inserted into the holder.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A lead frame holder for holding a plurality of elongated lead frames, said lead frames being for holding electronic component elements mounted thereon, said lead frames being held in parallel with each other, said holder comprising:

a holder body having at least two opposite side walls;

a plurality of guide shafts which are fixed between said two side walls of said holder body in parallel with each other for supporting a lowermost edge of a strip portion of each of said lead frames;

a plurality of holding plates which are arranged in said holder body in parallel with each other and which are passed through by said guide shafts for guiding said holding plates in a slidable manner; and a spring member which has a pressing position and a releasing position and which presses said holding plates in a direction along said guide shafts in said pressing position, wherein said spring member can exert enough pressure in said pressing position against said holding plates to stably hold said strip portion of each of said lead frames which is inserted between said holding plates.

2. A lead frame holder in accordance with claim 1, wherein said holder body is a rectangular framework which is open upward and downward.

3. A lead frame holder in accordance with claim 1, wherein said guide shafts are two round bars fixed in proximity to both sides of said holder body.

4. A lead frame holder in accordance with claim 1, wherein said spring member is a spring plate shaped like a letter $\Omega$ and whose end portions are passed through by said guide shafts.

5. A lead frame holder in accordance with claim 1, wherein a distance from an uppermost surface of each of said guide shafts to an upper end of each of said holding plates is made to be substantially equal to a width of said strip portion.

6. A lead frame holder in accordance with claim 1, further comprising a lead frame having an elongated strip portion and a plurality of lead terminals extending therefrom; at least some of said lead terminals having respective electronic component elements mounted thereon; said strip portion having a width direction extending upward from said lowermost edge thereof and upwardly with respect to said holder body; said holding plates having a thickness direction transverse to said guide shafts; wherein the spring member presses the holding plates in their thickness direction.

* * * * *